United States Patent
Steckel et al.

(10) Patent No.: US 12,259,439 B2
(45) Date of Patent: Mar. 25, 2025

(54) VOLTAGE TAP FOR MEASURING A VOLTAGE

(71) Applicant: Lisa Draexlmaier GmbH, Vilsbiburg (DE)

(72) Inventors: Michael Steckel, Vilsbiburg (DE); Guido Hofer, Weng (DE); Maximilian Baches, Taufkirchen (DE); Hendrik Mueller, Taufkirchen (DE)

(73) Assignee: Lisa Draexlmaier GmbH, Vilsbiburg (DE)

( * ) Notice: Subject to any disclaimer, the term of this patent is extended or adjusted under 35 U.S.C. 154(b) by 362 days.

(21) Appl. No.: 17/847,633

(22) Filed: Jun. 23, 2022

(65) Prior Publication Data
US 2023/0003807 A1    Jan. 5, 2023

(30) Foreign Application Priority Data
Jun. 30, 2021  (DE) ..................... 10 2021 116 787.6

(51) Int. Cl.
*G01R 31/3835*    (2019.01)
*G01R 31/36*    (2020.01)

(52) U.S. Cl.
CPC ..... *G01R 31/3835* (2019.01); *G01R 31/3644* (2013.01)

(58) Field of Classification Search
None
See application file for complete search history.

(56) References Cited

U.S. PATENT DOCUMENTS

| | | | | |
|---|---|---|---|---|
| 4,921,430 A | * | 5/1990 | Matsuoka | H01R 13/2442 439/931 |
| 5,013,248 A | * | 5/1991 | Brown | H01R 12/714 439/591 |
| 5,653,598 A | * | 8/1997 | Grabbe | H05K 7/1069 439/74 |
| 5,882,230 A | * | 3/1999 | Bricaud | G06K 7/0021 439/733.1 |
| 6,149,466 A | * | 11/2000 | Bricaud | G06K 7/0021 235/441 |
| 6,454,607 B2 | * | 9/2002 | Bricaud | G06K 7/0021 439/862 |
| 6,830,461 B2 | * | 12/2004 | Sakamoto | H05K 7/1069 257/E23.078 |
| 7,258,550 B2 | * | 8/2007 | Chen | H01R 13/2435 439/66 |

(Continued)

FOREIGN PATENT DOCUMENTS

| | | |
|---|---|---|
| CN | 112505571 | 3/2021 |
| DE | 112015005087 | 9/2017 |
| DE | 202018106375 | 12/2018 |

(Continued)

*Primary Examiner* — Tho D Ta
(74) *Attorney, Agent, or Firm* — Burris Law, PLLC

(57) ABSTRACT

A voltage tap for measuring a voltage includes at least one contact region and one abutment surface. Using the abutment surface, the voltage tap is electrically connectable to a contact surface of an electrical circuit board. The abutment surface comprises an enlarged surface with respect to the contact surface of the electrical circuit board, so that the electrical connection between the voltage tap and the electrical circuit board is provided independently of a movement of the voltage tap.

12 Claims, 3 Drawing Sheets

(56) References Cited

U.S. PATENT DOCUMENTS 9,184,529 B2 * 11/2015 Ulrich ................ H01R 13/2442
2008/0268690 A1 * 10/2008 Lu ..................... H01R 13/2442
                                                                                                                                                                           439/345

FOREIGN PATENT DOCUMENTS

FR          2763412 A1 * 11/1998 ......... G06K 13/0862
WO      2016077266     5/2016

\* cited by examiner

VOLTAGE TAP FOR MEASURING A VOLTAGE

CROSS-REFERENCE TO RELATED APPLICATIONS

This application claims priority to and the benefit of German Patent Application DE 10 2021 116 787.6, filed on Jun. 30, 2021. The disclosure of the above applications are incorporated herein by reference.

FIELD

The present disclosure relates to a voltage tap for measuring a voltage.

BACKGROUND

The statements in this section merely provide background information related to the present disclosure and may not constitute prior art.

In electrically powered vehicles, the energy for the drive of the vehicle is extracted from a battery. The battery is generally composed of a plurality of battery cells connected in parallel and in series. Due to the operation of the vehicle, energy is extracted from the battery so that the battery discharges. For the renewed use of the vehicle, the battery must be newly and regularly charged. This is effected, in one form, at charging stations or wall boxes. In addition, a part of the kinetic energy of the vehicle, for example, during braking, can be converted back into electricity and correspondingly fed back to the battery. Over the course of time these constant charging and discharging cycles can cause unequal charging states of the battery cells, which greatly accelerates the aging of the battery cells.

With the aid of voltage measurements of the individual battery cells or battery cell groups, the individual charging states of the battery cells or of the battery cell groups can be determined. When the charging state of each battery cell group or each battery cell has been determined, the charging states of all battery cell groups or battery cells can be equalized to one another via the known "cell balancing." Cables or plug systems are normally used for the electrical connection between an evaluation electronic system that evaluates the charging states based on the respective voltages, and optionally carries out the "cell balancing," and the individual battery cells.

A further solution is described in German Patent Application DE 20 2018 106 375 U1. A voltage tap and the cell connectors are manufactured from a conductive metal plate; the voltage tap is resiliently pressed onto a correspondingly placed circuit board and thus contacts.

SUMMARY

This section provides a general summary of the disclosure and is not a comprehensive disclosure of its full scope or all of its features.

In some applications, an issue may occur with the voltage taps used to date when determining the charging states. Specifically, the contact surface of the circuit board, but also the voltage tap itself, can become heavily worn down by relative movements of the voltage taps with respect to the contact surfaces of the circuit board. The relative movements and mechanical tensions can arise due to the vibrations arising in a moving vehicle, and due to the different expansion coefficients of the materials used of the voltage tap or of the contact surface of the circuit board.

One aspect of the present disclosure includes using the simplest possible constructive means, an improved contact, independent of relative movements, between a contact surface of a voltage tap and a contact surface of a circuit board, and to reduce wear of the contact surface of the voltage tap and of the contact surface of the circuit board.

One aspect of the present disclosure relates to a voltage tap for measuring a voltage comprising at least one contact region and one abutment surface by which the voltage tap is electrically connectable to a contact surface of an electrical circuit board, wherein the abutment surface comprises an enlarged surface with respect to the contact surface of the electrical circuit board, so that the electrical connection between the voltage tap and the electrical circuit board is provided independently of a movement of the voltage tap.

The voltage tap can be used, in one form, for measuring a voltage of one or more battery cells of a battery of an electrically powered vehicle. Using the voltage tap, the charging state of the battery cell can be measured during the electrical charging process of the battery, or during an operation of the electrically powered vehicle.

The voltage tap includes a contact region and a receiving surface. At the contact region, the voltage tap is contacted by a positive or negative terminal of the battery cell. Using the receiving surface, the voltage tap is contacted by the contact surface of the electrical circuit board. On the electrical circuit board sensors can be disposed that can be connected to an evaluation unit.

Other electronic components can furthermore be disposed on the electrical circuit board. The abutment surface of the voltage tap has an enlarged surface with respect to the contact surface of the electrical circuit board. The abutment surface is configured such that an electrical contact is provided between the abutment surface and the contact surface of the electrical circuit board independently of a movement of the voltage tap or of the electrical circuit board. In one form, the abutment surface can comprise a bulge in the region of the electrical connection to the contact surface.

In one form, the abutment surface is configured in the shape of a calotte. In the sense of the present disclosure, a "calotte" is understood to be a curved surface. Due to the curved surface, a continuous contact between the abutment surface of the voltage tap and the receiving surface is provided independently of a movement of the voltage tap. A precise measuring of the voltage of one or more battery cells can thus be affected, since the measurement is not interrupted when the voltage tap moves.

In one form, the voltage tap comprises rounded-off cut edges in the region of the abutment surface. It is thereby inhibited that the edges of the abutment surface and the contact surface of the circuit board wear, in one form, due to friction.

In one form, the abutment surface and/or the contact surface of the electrical circuit board is wetted with a lubricant in the region of the electrical connection, whereby a friction between the abutment surface and the contact surface of the electrical circuit board is reduced during the movement of the voltage tap. The lubricant can be an oil, in one form. Due to the wetting action of the lubricant, during a movement of the voltage tap the friction between the abutment surface and the contact surface is reduced. A lower wear of the abutment surface and of the contact surface thereby arises, and the material of the abutment surface and of the contact surface are worn down less. In addition, due to reduced wear and friction, a more permanent electrical contact is provided between the abutment surface and the contact surface.

In one form, the lubricant is a dielectric coolant. The dielectric coolant can be, in one form, a cooling oil. In one form, an entire battery module that contains battery cells and the voltage tap can float in a dielectric coolant. The dielectric coolant then serves for cooling of the battery cells and for reducing the friction between the abutment surface and the contact surface of the electrical circuit board.

In one form, the contact region is disposed on a cell connector of a battery cell. A cell connector is understood to be a connecting element that electrically connects a positive terminal of a first battery cell to a negative terminal of a second battery cell. In one form, the cell connector can comprise a contact crown. The contact crown can be welded onto the negative terminal of the second battery cell. The contact crown can comprise contact lugs that contact the positive terminal of the first battery cell, and an electrical connection between the first battery cell and the second battery cell is thus producible. The voltage tap can be configured to be a single piece with the cell connector. For example, the contact region of the voltage tap can be welded to the cell connector. For example, the contact lugs of the contact crowns can serve as electrical contacts of the first battery cell with the second battery cell, and additionally be configured as contacts of the battery cells with the voltage tap.

In one embodiment, the contact region comprises contact lugs that are arranged to electrically contact the battery cell. The contact lugs can contact the negative terminal of the battery cell. In the case of a round cell as the battery cell, the outer surface of the round cell forms the negative terminal. For example, the contact lugs can be disposed at the contact region such that the contact lugs enclose the negative terminal. The contact lugs can be resiliently supported so that they can compensate for tolerances during a movement of the battery cell or during movement of the voltage tap. Due to the resilient supporting, the contact lugs can also uniformly cling to the outer surface of the round cell.

In one form, the contact region contacts a plurality of positive poles or negative poles of a plurality of the battery cells, and the contact region comprises a plurality of electrically conductive contact elements, wherein each electrically conductive contact element respectively contacts a positive terminal or negative terminal of the battery cell. In one form, the contact region can comprise a plurality of contact crowns as electrically conductive contact elements. The electrically conductive contact elements can be connected to one another via connecting bridges, and disposed in a plurality of rows and columns with respect to one another. During operation of a battery, a measuring of the voltages of the plurality of battery cells can thus be affected very simply via a single voltage tap.

In one form, the voltage tap is manufactured from a stamped bent part. The manufacturing of the voltage tap can thereby be affected in a cost-effective and automated manner. In one form, the voltage tap can be manufactured from a first metal plate and from a second metal plate that are disposed one-atop-the-other connected to each other. The first metal plate can have a better electrical conductivity than the second plate, and the second metal plate can have a greater spring stiffness, in one form also a lower stress relaxation, than the first metal plate. Due to this hybrid design of the stamped bent part, both the mechanical requirements and the requirements with respect to the electrical conductivity can equally be fulfilled. The two metal plates can be manufactured from the different materials, in one form, by cold rolling.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

Figure 1:
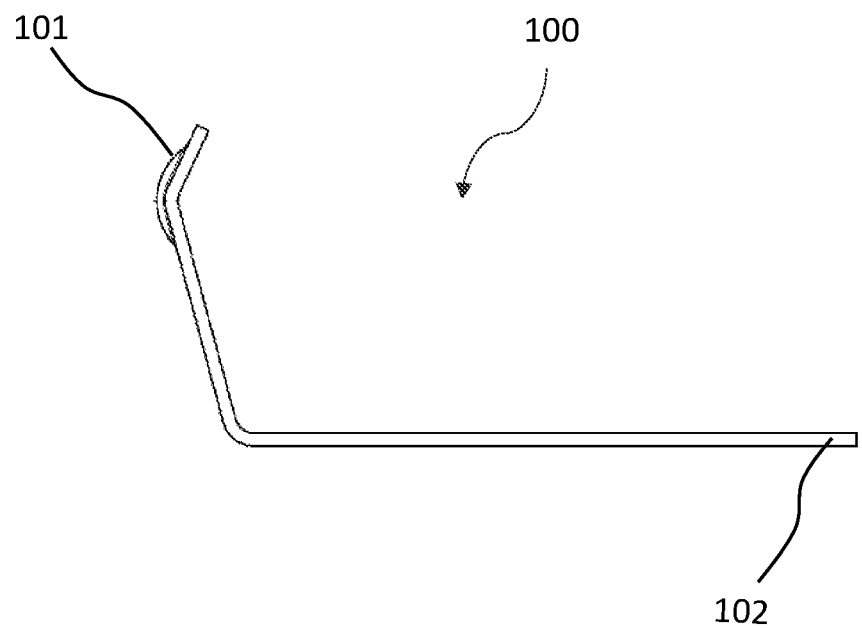
FIG. 1 shows a voltage tap in a first form, according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows a voltage tap 100 for measuring a voltage in a first form. Using the voltage tap 100, voltages, in one form, of one or more battery cells of an electrically powered vehicle can be measured. The voltage tap 100 comprises a contact region 102 and a receiving surface 207 (shown in FIG. 3).

In the contact region 102, the voltage tap 100 is electrically contactable by an electrical component, in one form, a battery cell. The voltage tap 100 also comprises an abutment surface 101.

Figure 2:
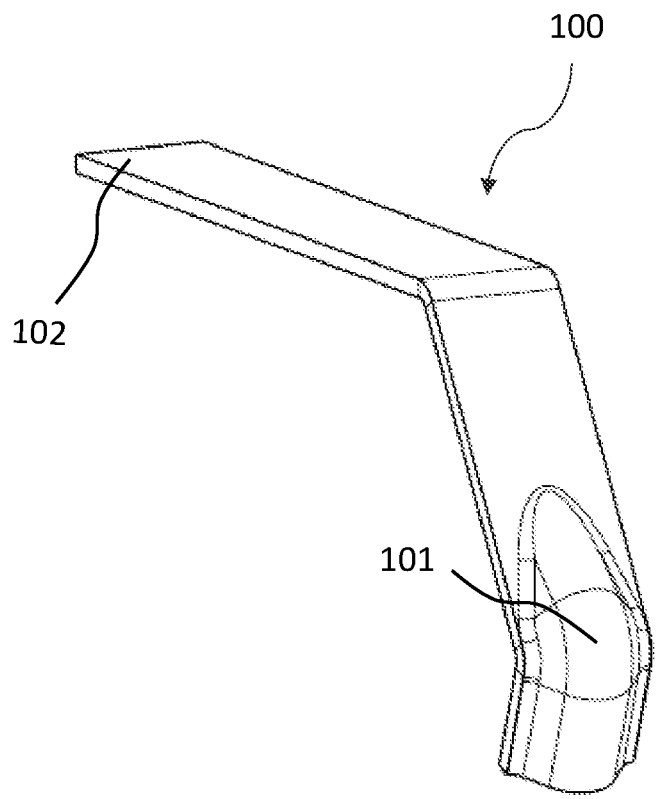
FIG. 2 shows the voltage tap in the first form in a perspective depiction, according to the teachings of the present disclosure.

FIG. 2 shows the voltage tap in the first form in a perspective view. In the first form, the abutment surface is a curved surface. Using the curved abutment surface 101, the voltage tap 100 can contact against a contact surface of the circuit board by at least one part of the curved abutment surface 101 abutting against the contact surface of the circuit board.

Figure 3:
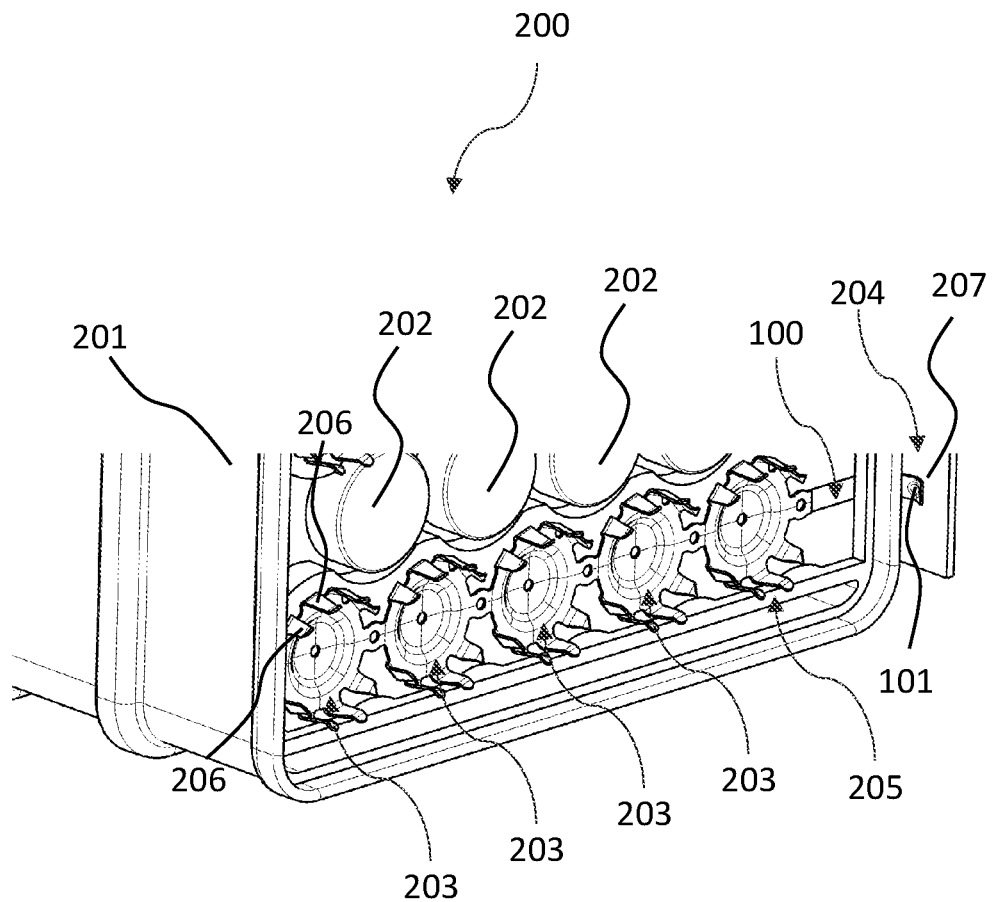
FIG. 3 shows a section of a battery module including a voltage tap in a second form, according to the teachings of the present disclosure.

FIG. 3 shows a section of a battery module 200 including a voltage tap 100 in a second form. In the battery module 200, a plurality of battery cells 202 are disposed in rows offset with respect to one another. In the second form, the battery cells 202 are round cells. In another form, the battery cells 202 can be pouch cells or prismatic cells. The battery cells 202 are connected to one another in parallel via a cell connector 205 and surrounded by a battery module housing 201.

Contact crowns 203 of a cell connector 205 are respectively welded onto the battery cells 202. The cell connector 205 serves for contacting a positive pole of a battery cell including a negative pole of a further batter cell. The contact crowns 203 simultaneously serve as contact elements for electrical contacting of the battery cells 202 with the voltage tap 100. In the second form, the voltage tap 100 is configured to be a single piece with the contact crowns 203 of the cell connector. The abutment surface 101 of the voltage tap 100 abuts against the contact surface of a circuit board 204 and contacts the circuit board 204. Since the abutment surface 101 is curved and thus has an enlarged surface, a contacting of the abutment surface 101 against the contact surface of the circuit board 204 is provided at any time independent of a movement of the voltage tap 100, and precise measurement values of the voltages of the battery cells 202 can thus be detected. Via the voltage tap 100, it is not necessary to monitor each of the battery cells 202, connected in parallel using the cell connector 18, with respect to their voltage.

In one form, the contact crown 203 can comprise contact lugs 206 that contact the positive terminal of the first battery cell, and an electrical connection between a first battery cell and a second battery cell is thus producible.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A voltage tap for measuring a voltage comprising:
at least one contact region; and
an abutment surface coupled to a portion of the at least one contact region, the abutment surface electrically connectable to a contact surface of an electrical circuit board, the abutment surface comprises an enlarged surface with respect to the contact surface of the electrical circuit board and at least one of the abutment surface and the at least one contact surface of the electrical circuit board is wetted with a lubricant in a region of the electrical connection.

2. The voltage tap according to claim 1, wherein the abutment surface is configured in a shape of a calotte.

3. The voltage tap according to claim 1 further comprises rounded cut edges in a region of the abutment surface.

4. The voltage tap according to claim 1, wherein the lubricant is a dielectric coolant.

5. The voltage tap according to claim 1, wherein the at least one contact region is disposed on a cell connector of a battery cell.

6. The voltage tap according to claim 1, wherein the at least one contact region is manufactured from a stamped bent part.

7. A voltage tap for measuring a voltage comprising:
at least one contact region; and
an abutment surface coupled to a portion of the at least one contact region, the abutment surface electrically connectable to a contact surface of an electrical circuit board, the abutment surface comprises an enlarged surface with respect to the contact surface of the electrical circuit board and the at least one contact region comprises a set of contact lugs that are configured to electrically contact a battery cell.

8. The voltage tap according to claim 7, wherein the at least one contact region contacts a plurality of positive poles or negative poles of a plurality of battery cells, and the at least one contact region comprises a plurality of electrically conductive contact elements, wherein each electrically conductive contact element respectively contacts a positive terminal or negative terminal of the battery cell.

9. The voltage tap according to claim 7, wherein the at least one contact region is manufactured from a stamped bent part.

10. The voltage tap according to claim 7, wherein the abutment surface is configured in a shape of a calotte.

11. The voltage tap according to claim 7 further comprises rounded cut edges in a region of the abutment surface.

12. The voltage tap according to claim 7, wherein the at least one contact region is disposed on a cell connector of the battery cell.

* * * * *